(12) United States Patent
Nakamura

(10) Patent No.: US 6,597,033 B1
(45) Date of Patent: Jul. 22, 2003

(54) SEMICONDUCTOR MEMORY DEVICE AND MANUFACTURING METHOD THEREOF

(75) Inventor: Ryoichi Nakamura, Tokyo (JP)

(73) Assignees: NEC Corporation, Tokyo (JP); NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/552,583

(22) Filed: Apr. 19, 2000

(30) Foreign Application Priority Data

Apr. 20, 1999 (JP) .......................................... 11-112899

(51) Int. Cl.[7] ............................................ H01L 27/108
(52) U.S. Cl. ........................................ 257/311; 257/309
(58) Field of Search ................................ 257/306, 309, 257/307, 311; 438/253, 255, 396

(56) References Cited

U.S. PATENT DOCUMENTS 4,037,307 A * 7/1977 Smith .......................... 438/301
5,252,517 A * 10/1993 Blalock et al. .............. 438/396
5,278,091 A * 1/1994 Fazan et al. ................. 438/398
5,686,337 A * 11/1997 Koh et al. .................... 438/240
6,037,216 A * 3/2000 Liu et al. ..................... 438/253
6,051,859 A * 4/2000 Hosotani et al. ............ 257/306
6,077,742 A * 6/2000 Chen et al. .................. 438/255
6,150,690 A * 11/2000 Ishibashi et al. ............ 257/306
6,228,711 B1 * 5/2001 Hsieh .......................... 438/255

FOREIGN PATENT DOCUMENTS

JP          10-79478           3/1998

* cited by examiner

Primary Examiner—George Eckert
(74) Attorney, Agent, or Firm—McGinn & Gibb, PLLC

(57) ABSTRACT

A semiconductor device of the present invention has a plurality of capacitors having a cylindrical lower electrode which is formed along the side and the bottom surface of a recess formed in an insulator film over a semiconductor substrate and which is made of silicon having a lot of grained silicon on the surface, and a protector film with resistance to etching of a silicon oxide film is formed at least on the upper surface of the insulator film positioned between the adjacent lower electrodes.

10 Claims, 8 Drawing Sheets

(a)

(b)

(c)

(a)

(b)

PRIOR ART

(a)

PRIOR ART

(b)

PRIOR ART

(c)

SEMICONDUCTOR MEMORY DEVICE AND MANUFACTURING METHOD THEREOF

BACKGROUND OF THE INVENTION

1. Field of the Invention

The present invention relates to a semiconductor memory device and a manufacturing method thereof, and more particularly, relates to a semiconductor memory device having a capacitor in which lamination is performed like a cylinder over a semiconductor substrate, a so-called cylindrical stack-type capacitor, and a manufacturing method thereof.

2. Description of the Prior Art

Recently, in case of a semiconductor device such as a DRAM (Dynamic Random Access Memory) or the like, in order to realize a high integration, it is required to increase an electrostatic capacity per occupied area of a capacitor configuring each memory cell. Therefore, complying with this request, a capacitor having a stereo-structure such as a stack-type capacitor formed by performing lamination over a substrate or a trench-type capacitor formed by digging a substrate deeply is often used. At this moment, means for increasing the electrostatic capacity by shaping a storage electrode (lower electrode) configuring each capacitor like a cylinder is employed.

Furthermore, for an electrode material of a capacitor, polysilicon is often used, and an attempt is also made, in which a lot of hemi-spherical grained silicon (hereafter, referred to as HSG) is formed on the surface of this polysilicon electrode and the surface area of the electrode is increased by making the surface uneven so that the electrostatic capacity may be increased.

As one example of this type of capacitor structure, a structure in which a capacitor is made in a recess provided in an insulator film over the substrate is disclosed in Japanese Patent Laid-Open No. 10-79478 or the like. This type of conventional DRAM memory cell is shown in FIG. 8A to FIG. 8C. FIG. 8A to FIG. 8C especially shows the processes of forming a storage electrode which is one electrode of a capacitor in order. As shown in FIG. 8A, a transistor 104 having a gate electrode 101 and n-type impurity diffusion layers 102, 103 of the source and drain areas is formed on a silicon substrate 100, and after that, a first interlayer insulator film 105 is formed on the entire surface. Next, a bit contact hole 106 which penetrates the first interlayer insulator film 105 to reach the n-type impurity diffusion layer 102 is formed, and a bit line 107 electrically connected to the n-type impurity diffusion layer 102 through the bit contact hole 106 is formed.

Next, a second interlayer insulator film 108 is formed on the entire surface, and a capacity contact hole 109 which penetrates the second interlayer insulator film 108 and the first interlayer insulator film 105 to reach the n-type impurity diffusion layer 103 is formed, and after that, the capacity contact hole 109 is filled up with polysilicon. Next, a third interlayer insulator film 110 is formed on the entire surface, and after that, this is patterned to form a recess 110a at a capacitor forming place. Then, a polysilicon film is formed on the entire surface, and after that, the polysilicon film on the upper surface of the third insulator film 110 is removed by chemical mechanical polishing (hereafter referred to as CMP), and in the meantime, the polysilicon film is left being shaped like a cylinder only on the side and the bottom surface of the recess 110a, and this is made to be a storage electrode 111. By the way, it is usual to use a material of the silicon oxide film family such as $SiO_2$ or BPSG for an interlayer insulator film such as the first interlayer insulator film 105, the second interlayer insulator film 108, or the third interlayer insulator film 110.

An original form of a storage electrode is completed up to the process shown in the above described FIG. 8A, and here, in order to enlarge the surface area of the storage electrode so that the capacity of a capacitor may be increased, HSG is formed on the surface of a polysilicon film of the storage electrode. At the time of reaction of the HSG formation, a movement of silicon atoms in the polysilicon film is accompanied, and here, if an oxide film is formed on the surface of the polysilicon film, the movement of the silicon atoms is prevented by the existence of the oxide film, and there are some cases where HSG with a sufficient grain diameter does not grow.

By the way, in the manufacturing process, when a time of a certain extent elapses in the state where the polysilicon film is exposed, a natural oxide film of some nm or less is formed on the surface of the polysilicon film. However, as mentioned above, this natural oxide film becomes a factor to prevent the growth of HSG, and therefore, usually, as a pretreatment of the HSG formation process, removing of the natural oxide film on the surface of the polysilicon film is performed. In this pretreatment process, it is usual to perform removing of the natural oxide film by soaking a wafer in the etchant including hydrofluoric acid often used for removing a silicon oxide film in the semiconductor manufacturing process.

However, in the wafer which has passed through this HSG pretreatment process, not only the natural oxide film on the surface of the polysilicon film is removed, but also as shown in FIG. 8B, the third interlayer insulator film 110 exposed to the uppermost surface is also a little etched, and the state becomes a state where the upper end of the cylindrical storage electrode 111 is a little projecting from the upper surface of the third interlayer insulator film 110. In this state, when the heat treatment of the wafer is performed in a gaseous atmosphere containing silicon, as shown in FIG. 8C, HSG 112 is formed on the entire exposed surface of the polysilicon film of the storage electrode 111.

In the case where two capacitors close to each other exist in a memory cell array, before the HSG pretreatment, as shown in FIG. 8A, both storage electrodes 111 are completely separated by the third interlayer insulator film 110, but after the HSG pretreatment, as shown in FIG. 8B, the upper surface of the third interlayer insulator film 111 retreats, and therefore, the outer surface sides of the fellow upper ends of both storage electrodes 111 face to each other (place indicated by the mark C). Here, when the HSG treatment is performed, as shown in FIG. 8C, the HSG 112 is also formed on this outer surface side, and therefore, the state becomes a state where the fellow HSG's 112 of the upper end outer surfaces of these two adjacent storage electrodes 111 are close to each other. In some cases, there has been a probability that these HSGIs, that is, the storage electrodes cause a failure of a short circuit and that the yield is lowered.

In future, as the fining of a DRAM is improved, when the space between the adjacent memory cells is narrowed, the space between the capacitors requiring a large occupied area in the memory cell naturally cannot also help being narrowed, and in the design, the case where two storage electrodes are arranged extremely close to each other is increased. Usually, the grain diameter of HSG is about 0.05 to 0.1 $\mu$m, and therefore, in order to that the fellow HSG's of the adjacent storage electrodes may not cause a short circuit, the space between the adjacent storage electrodes must be designed to have a wide length, for example, 0.3 μm with a margin of some extent, and it results in giving a limit to the fining of a memory cell. That is, a conflicting situation has been made, in which at the time of performing the fining of a memory cell, in order to ensure a specific capacity in the limited occupied area, a method of forming HSG in the storage electrode is employed but on the other hand, the formation of HSG gives a limitation to the fining of a memory cell in reverse, in the adjacent storage electrodes.

BRIEF SUMMARY OF THE INVENTION

OBJECT OF THE INVENTION

It is an object of the present invention to provide a semiconductor memory device with a structure by which in a capacitor with a cylindrical lower electrode having HSG formed on the surface, even when the fellow adjacent lower electrodes are arranged close to each other, a failure of a short circuit does not occur between these lower electrodes, and a manufacturing method thereof.

SUMMARY OF THE INVENTION

A semiconductor device of the present invention comprises a plurality of capacitors which are formed along the side and the bottom surface of a recess formed on an insulator film over a semiconductor substrate and which have a cylindrical lower electrode made of silicon with a lot of grained silicon on the surface, and wherein a protector film which has resistance to etching of a silicon oxide film is formed at least on the upper surface of the insulator film positioned between the adjacent lower electrodes.

Then, as the above described protector film, any one of a silicon nitride film ($Si_3N_4$), an aluminum oxide film($Al_2O_3$), or a silicon carbide film(SiC) can be employed. Furthermore, it is also possible that the above described capacitor configures a memory cell of a DRAM together with a transistor formed on the semiconductor substrate. In that case, the present invention can also be applied to any one of a memory cell with a structure where the capacitor is provided over a bit line, the so-called COB (capacitor over bit-line) structure, or a memory cell with a structure where the capacitor is provided under a bit line, the so-called CUB (capacitor under bit-line) structure.

Furthermore, a manufacturing method of a semiconductor device of the present invention comprises the steps of: forming an insulator film over a semiconductor substrate; forming a protector film having resistance to etching of a silicon oxide film on the upper surface of the insulator film; forming a recess whose bottom surface reaches the insulator film by pattering the protector film and the insulator film; forming a silicon film to be a lower electrode of a capacitor at least along the side and the bottom surface of the recess; removing a silicon oxide film formed on the surface of the silicon film by using etchant of a silicon oxide film; and forming a lot of grained silicon on the surface of the silicon film and of forming a lower electrode of a cylindrical capacitor.

Then, as a material of the above described protector film, any one of a $Si_3N_4$ film, an $Al_2O_3$ film, or an SiC film can be used. Furthermore, in the above described process of forming a silicon film, a method can be employed, in which after forming a silicon film on the entire surface of the substrate including the side and the bottom surface of the recess, the protector film is exposed by removing the silicon film on the upper surface of the protector film by performing CMP and in the meantime, the silicon film is left on the side and the bottom surface of the recess. Furthermore, it is preferable that when performing CMP, a protector member for protecting the silicon film on the side and on the bottom surface of the recess is buried in the recess in advance and after finishing CMP, the protector member is removed.

Previously, at the time of removing the natural oxide film by hydrofluoric acid etching of the pretreatment of the HSG formation process, the insulator film of the silicon oxide film family has been exposed to the surface, and therefore, the insulator film existing between the adjacent lower electrodes has retreated, and a short circuit has occurred between the fellow HSG's formed on the outer surface side at the upper end of the lower electrode. On the other hand, in case of the present invention, on the upper surface of the insulator film existing between the adjacent lower electrodes, a protector film having resistance to etching of a silicon oxide film, for example, an $Si_3N_4$ film, an $Al_2O_3$ film, or an SiC film is formed, and therefore, even if hydrofluoric acid etching of the HSG pretreatment is performed, this part does not retreat, and the upper end of the cylindrical lower electrode does not project to the above of the protector film. Accordingly, it does not occur for the outer surfaces of the fellow adjacent lower electrodes to face to each other, and it does not occur for the HSG's to grow in the mutually approaching direction, so that a failure of a short circuit can surely be prevented from occurring.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

A first embodiment of the present invention will be described below by referring to FIG. 1 to FIG. 5.

Figure 1:
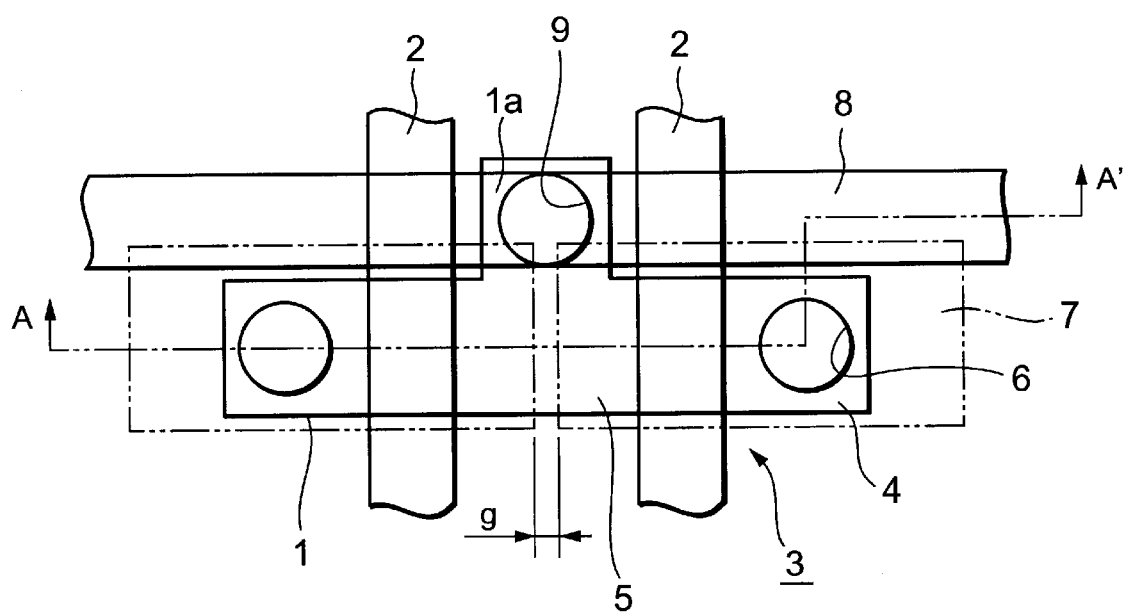
FIG. 1 is a plan view showing a memory cell of a DRAM which is a first embodiment of the present invention.
Figure 2:
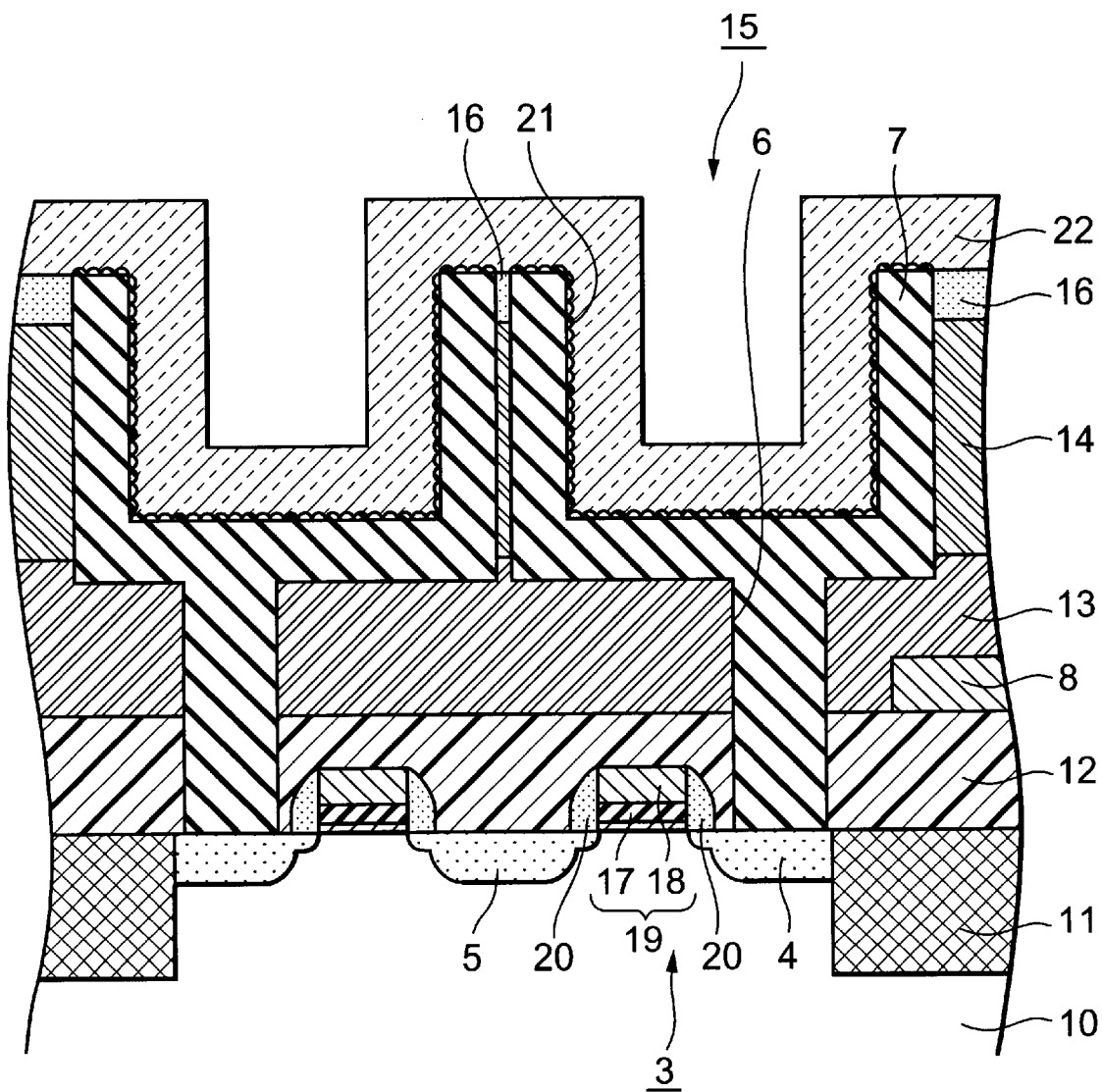
FIG. 2 is a cross sectional view along a line A–A' of FIG. 1.

FIG. 1 is a plan view showing a memory cell of a DRAM (semiconductor device) of this embodiment, and FIG. 2 is a cross sectional view along the line A–A' of FIG. 1, and FIG. 3 to FIG. 5 are process flow figures showing a manufacturing process of the above described memory cell. The embodiment is an example in which the present invention is applied to a DRAM memory cell with the COB structure.

Herein, in the present specification, as an abbreviated term of grained silicon, a term "HSG" is used. Originally, HSG includes a meaning of "hemi-spherical", but the shape of actual grained silicon is not limited to a hemi-spherical shape, but it can be a shape like a mushroom, and it also includes a desired unsettled shape. However, for the sake of convenience of illustrating, it will be illustrated to have a hemispherical shape in the figure.

As shown in FIG. 1, two gate lines 2 cross in one diffusion layer pattern 1, and two transistors 3 are formed. On an n-type impurity diffusion layer 4 configuring a source area (or a drain area) of each transistor, a capacity contact hole 6 is formed, and a patter of a storage electrode 7 is formed including the capacity contact hole 6 in the interior, respectively. In case of the COB structure, in order to prevent a short circuit between the storage electrode and the bit line from occurring at the capacity contact hole portion, the bit line cannot be arranged on the capacity contact hole, and therefore, the bit line 8 is arranged in parallel with the diffusion layer pattern 1 to be at right angles to the gate line 2 while being away from the diffusion layer pattern 1 (upper portion in FIG. 1), and in the meantime, a connecting portion 1a extending on the bit line 8 is formed at the center of the diffusion layer pattern 1, and a bit contact hole 9 is arranged on this connecting portion 1a. In case of this embodiment, a place between two left and right storage electrodes 7 on one diffusion layer pattern 1 shown in FIG. 1 is the place with the narrowest space of the fellow storage electrodes 7 in the total of the memory cell array, and the space g is, for example, about 0.15 $\mu$m.

The cross sectional structure of the above described memory cell will be described by using FIG. 2. On the surface of a silicon substrate 10, a trench element separation oxide film 11 is formed, and in the active area except the element separation area, two transistors 3 are formed. Over each transistor 3, a cylindrical capacitor 15 (hereafter, referred to simply as a capacitor) shaped to be buried in the interior of a third interlayer insulator film 14 is formed through a first interlayer insulator film 12 and a second interlayer insulator film 13, and on the third interlayer insulator 14, a protector film 16 is formed. Furthermore, on the first interlayer insulator film 12 under the capacitor 15, a bit line 8 is formed. As for the material of each film in this embodiment, the material of the first interlayer insulator 12 and the second interlayer insulator 13 is a lamination layer film of a silicon oxide film and BPSG (which is illustrated as a 1-layer film in FIG. 1 and FIG. 3 to FIG. 5), and the material of the third interlayer insulator film 14 is a lamination layer film of a silicon oxide film and BPSG or a single layer film of a plasma silicon oxide film, and the material of the protector film 16 is a plasma silicon nitride film.

The transistor 3 has a gate electrode 19 and n-type impurity diffusion layers 4, 5 which are the source area and drain area. The gate electrode 19 is made of a tungsten polycide film of a polysilicon film 17 in which impurities such as phosphorus are doped (hereafter, referred to as a DOPOS FILM) and a tungsten silicide film 18, and at the side wall of the gate electrode 19, a side wall 20 is formed, and the n-type impurity diffusion layers 4, 5 have the LDD structure. To one n-type impurity diffusion layer 4 of the transistor 3, the storage electrode 7 (lower electrode) of the capacitor 15 is connected through the capacity contact hole 6, and on the surface of the silicon film of the storage electrode 7, a lot of HSG 21 is formed. Then, on the storage electrode 7, a capacity insulator film (omitted in the figure) and a counter electrode 22 (upper electrode) are formed in turn, and a capacitor 15 is configured. For the storage electrode 7 and the counter electrode 22, a polysilicon film is used, and for the capacity insulator film, a silicon nitride film is used.

Figure 3:
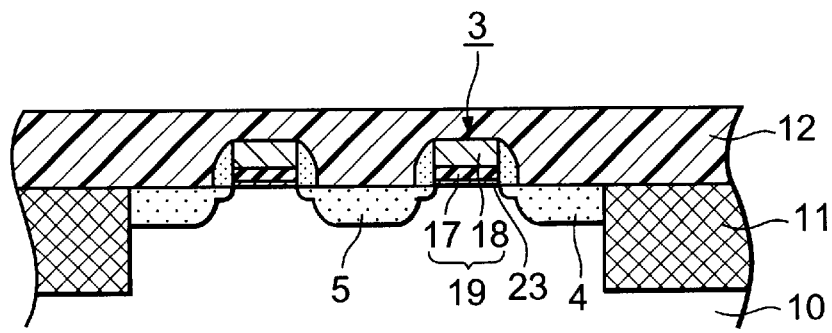
FIG. 3 is a process cross sectional view showing a manufacturing process of a memory cell of the present invention.
Figure 3:
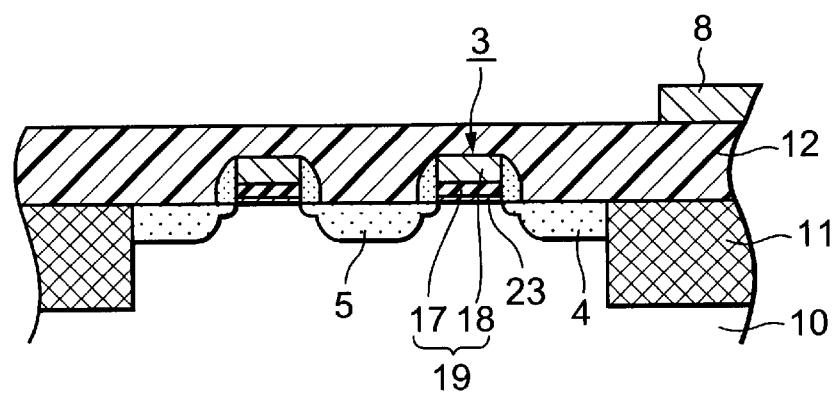
Figure 3:
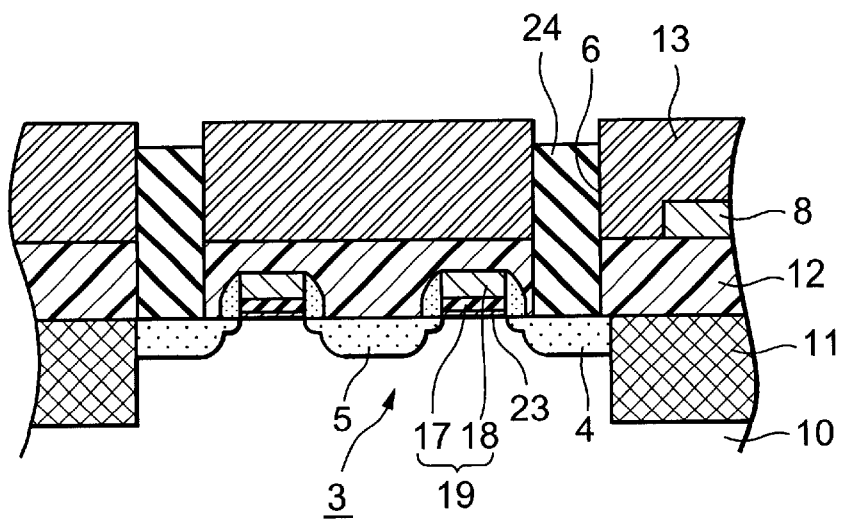
Figure 4:
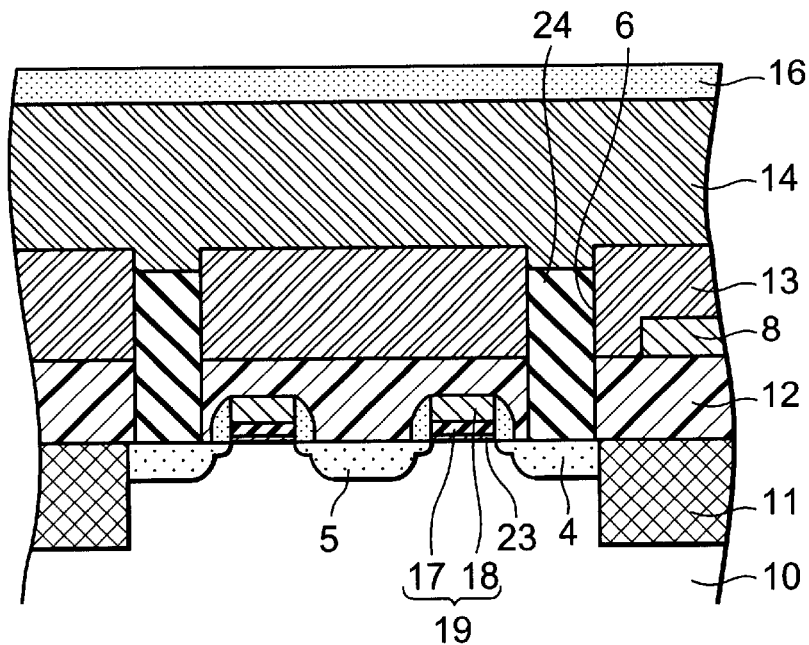
FIG. 4 is a process cross sectional view showing a manufacturing process of a memory cell of the present invention.
Figure 4:
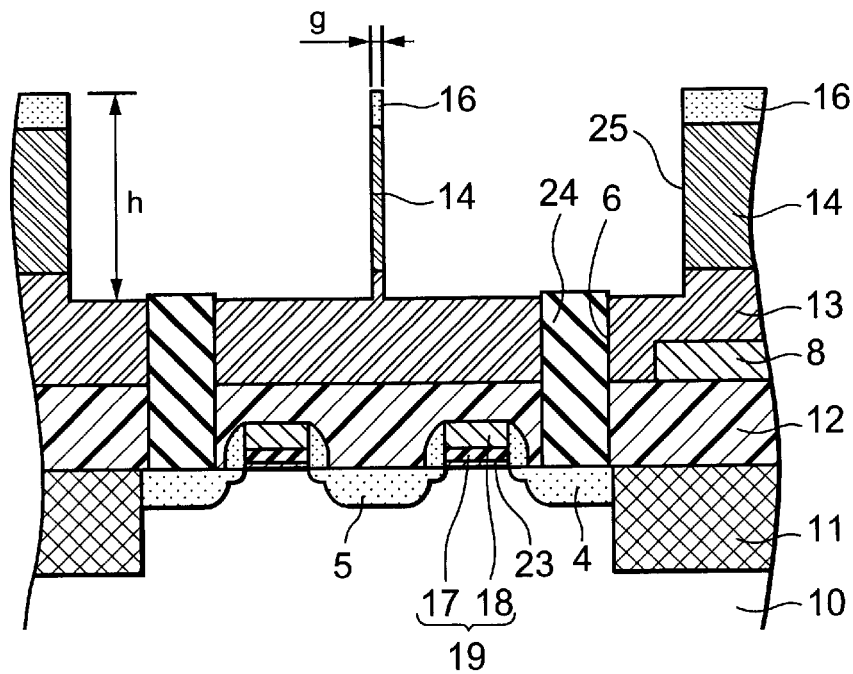
Figure 5:
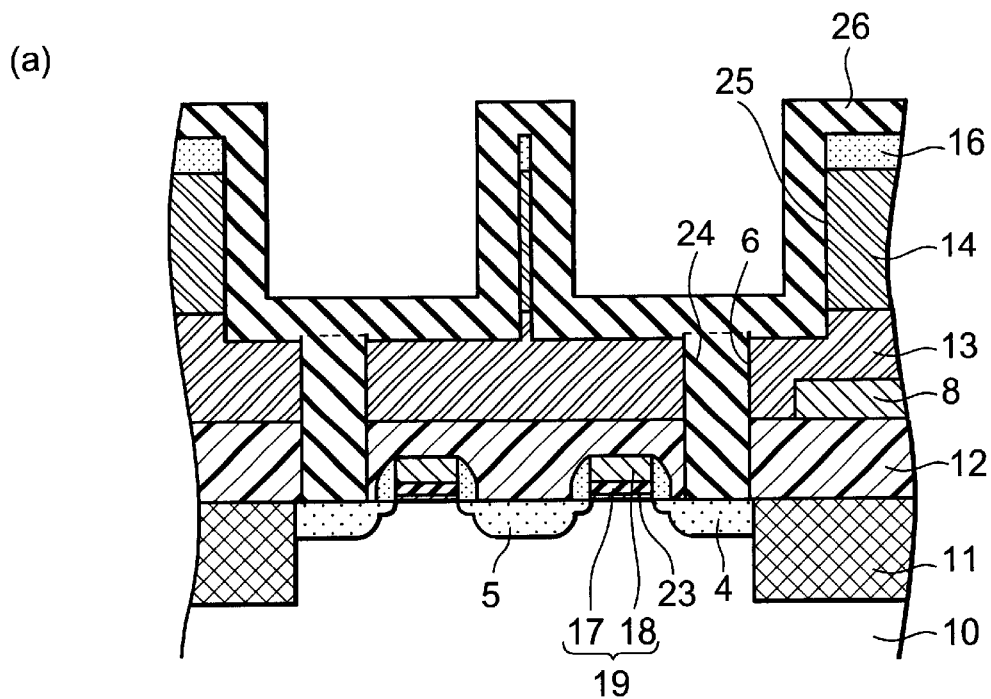
FIG. 5 is a process cross sectional view showing a manufacturing process of a memory cell of the present invention.
Figure 5:
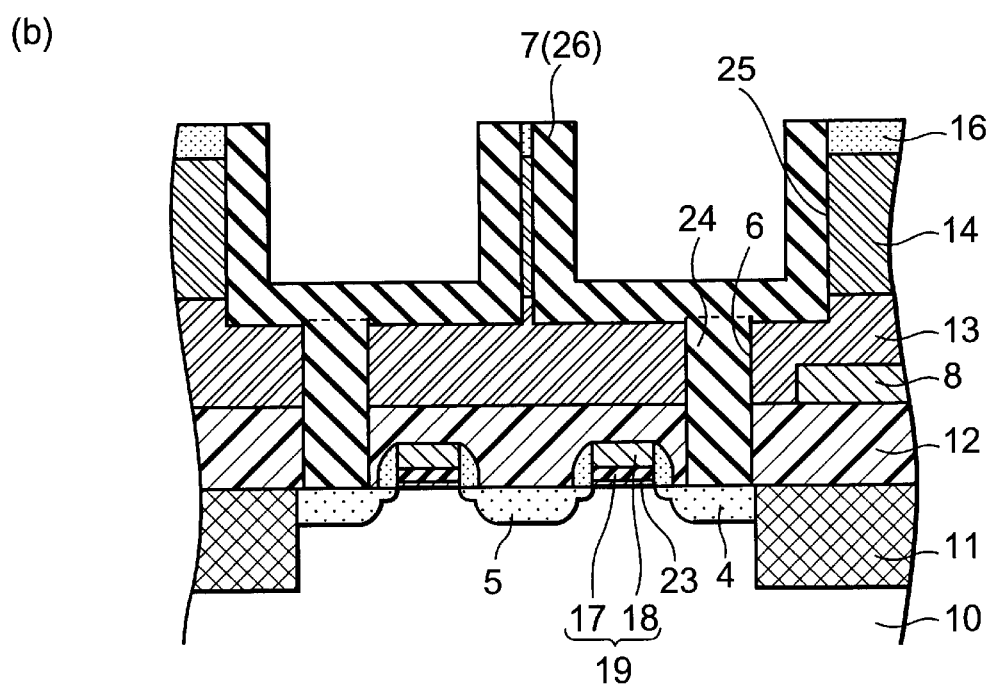

A manufacturing method of a DRAM memory cell with the above described configuration will be described below by using FIG. 3 to FIG. 5.

First, as shown in FIG. 3A, on the silicon substrate 10, a trench element separation oxide film 11 with a depth of about 400 nm is formed, and after that, a gate oxide film 23 with a film thickness of 8 nm is formed. Next, a DOPOS film 17 with a film thickness of 100 nm and a tungsten silicide film 18 with a film thickness of 100 nm which configure a gate electrode 19 are formed on the entire surface of the substrate in turn, and these are patterned to form a gate electrode 19 with a gate length of about 0.23 $\mu$m. Next, in order to form n-type impurity diffusion layers 4, 5 with the LDD structure, the phosphorus ion is ion-injected by a dosage of $1 \times 10^{13}/cm^2$ and an acceleration energy of 30 keV to form a low density impurity diffusion layer, and by a silicon oxide film or a silicon nitride film with a film thickness of about 100 nm, a side wall 20 is formed at the side wall of the gate electrode 19, and after that, the arsenic ion is ion-injected by a dosage of $7 \times 10^{13}/cm^2$ and an acceleration energy of 50 keV, and a high density impurity diffusion layer is formed to be n-type impurity diffusion layers 4, 5.

Next, a first interlayer insulator film 12 is formed on the entire surface to cover the transistor 3. At this moment, a silicon oxide film with a film thickness of 100 nm and a BPSG film with a film thickness of 400 nm are formed to be the first interlayer insulator film 12 with a total film thickness of 500 nm. After that, CMP is performed to flatten the surface of the first interlayer insulator film 12. After performing CMP, the film thickness of the first interlayer insulator film 12 becomes about 200 nm at the part on the gate electrode 19.

Next, as shown in FIG. 3B, a bit contact hole 9 which penetrates the first interlayer insulator film 12 and reaches the n-type impurity diffusion layer 5 of the transistor 3 is formed. The part of the bit contact hole 9 is not shown in FIG. 3B, and the hole diameter is 0.25 $\mu$m. Next, a tungsten silicide film with a film thickness of 150 nm to be a bit line 8 is formed on the entire surface, and this is patterned with a line width of about 0.2 $\mu$m to be a bit line 8. At this moment, in the interior of the bit contact hole 9, the tungsten silicide is also buried, and the bit line 8 is electrically connected to the n-type impurity diffusion layer 5. By the way, for the material of the bit line 8, not only tungsten silicide but also tungsten, tungsten polycide, or the like can be used.

Next, as shown in FIG. 3C, a second interlayer insulator film 13 is formed on the entire surface to cover the bit line 8. At this moment, a silicon oxide film with a film thickness of 100 nm and a BPSG film with a film thickness of 600 nm are formed to be a second interlayer insulator film 13 with a total film thickness of 700 nm. After that, CMP is performed to flatten the surface of the second interlayer insulator film 13. Next, a capacity contact hole 6 which penetrates both the second interlayer insulator film 13 and the first interlayer insulator film 12 to reach the n-type impurity diffusion layer 4 of the transistor 3 is formed. The hole diameter is 0.25 $\mu$m similarly to the bit contact hole 9. Next, by using the low pressure CVD method, a DOPOS film 24 with a film thickness 300 nm is formed on the entire surface, and after that, if the DOPOS film 24 is etched back, the state becomes a state where the DOPOS film 24 is buried only in the interior of the capacity contact hole 6. Here, it is also possible to perform CMP to remove the excessive DOPOS film 24, instead of the etch back.

Next, as shown in FIG. 4A, a third interlayer insulator film 14 is formed on the entire surface. At this moment, similarly to the second interlayer insulator film 13, a silicon oxide film with a film thickness of 100 nm and a BPSG film with a film thickness of 600 nm are formed to be a third interlayer insulator film 14 with a total film thickness of 700 nm. Next, by using the plasma CVD method, a silicon nitride film with a film thickness of 100 nm is formed to be a protector film 16. In this insulator film formation process, it is also possible that a silicon oxide film is used as the third interlayer insulator film 14 instead of using a lamination layer film of a silicon oxide film and a BPSG film and that a third interlayer insulator film of a silicon oxide film and a protector film of a silicon nitride film are continuously formed by using the plasma CVD method.

Next, as shown in FIG. 4B, by patterning the protector film 16 and the third interlayer insulator film 14 by using the well known photo lithography etching method, a recess 25 for forming a cylindrical storage electrode 7 is formed. At this moment, in order to connect the cylindrical part of the storage electrode 7 and the DOPOS film 24 in the capacity contact hole 6, the etching condition is set so that the second interlayer insulator 13 may also be etched by about 200 nm in order that the upper end of the DOPOS film 24 in the capacity contact hole 6 is projected a little into the recess 25. Consequently, the height h of the cylindrical part becomes about 1 μm. Furthermore, the width g of the parts of the protector film 16 and the third interlayer insulator film 14 remaining between the adjacent recesses 25 is about 0.15 μm.

Next, as shown in FIG. 5A, an amorphous silicon film 26 with a film thickness of 200 nm is formed on the entire surface by using the low pressure CVD method to cover the side and the bottom surface of the recess 25. This amorphous silicon film 26 becomes the storage electrode 7 later. Here, it is also possible to use a lamination layer film of a polysilicon film and an amorphous silicon film instead of the amorphous silicon film 26.

Here, the posi-type resist (not shown in the figure) is coated on the entire surface, and the exposure of the entire surface is performed, and after that, the development is performed. Then, the resist existing over the protector film 16 and the third interlayer insulator film 14 is removed, but the unexposed resist remains only in the recess 25, and this resist works as a protector member for protecting the cylindrical amorphous silicon film 26 in the next CMP process. In this state, when CMP is next performed, as shown in FIG. 5B, the amorphous silicon film 26 existing over the protector film 16 and the third interlayer insulator film 14 is removed, and the amorphous silicon film 26 remains only at the part along the side and the bottom surface of the recess 25, and a storage electrode 7 is formed. After the CMP, the unnecessary resist is removed.

Next, by performing the hydrofluoric acid treatment as the pretreatment of the HSG formation process of the amorphous silicon film 26 of the storage electrode 7, the natural oxide film with a film thickness of several nm or less formed on the surface of the amorphous silicon film 26 is removed. At this moment, an etchant of 1 part of hydrofluoric acid in 200 parts of water is used, and the wafer is soaked in this etchant for 8 minutes. After that, the IPA drying is performed.

Next, when a heat treatment is performed at a temperature of about 550° C. to 580° C. under a high vacuum in a gaseous atmosphere including silicon atoms such as gaseous monosilane or gaseous disilane, as shown in FIG. 2, HSG 21 grows on the surface of the amorphous silicon film 26, and a storage electrode 7 with a large surface area is formed. After that, on the storage electrode 7, a capacity insulator film made of a silicon nitride film is formed, and next, a counter electrode 22 made of a DOPOS film is formed. By the above described processes, a DRAM memory cell of this embodiment shown in FIG. 2 is completed.

In a DRAM memory cell of this embodiment, a silicon nitride film is formed as a protector film 16 on the third insulator film 14, but the silicon nitride film has the etching resistance to hydrofluoric acid, and therefore, even if the hydrofluoric acid etching is performed for removing the natural oxide film as the pretreatment of the HSG formation process, the protector film 16 and the third insulator film 14 are not removed to remain as they are. Therefore, the upper end of the cylindrical storage electrode 7 does not project to the above of the insulator film though it projects in case of a conventional manufacturing method in which the protector film is not formed.

The process applied in this embodiment is a process of fining in which the gate length is about 0.23 μm, and since the space between the adjacent storage electrodes 7 is 0.15 μm, it is sufficiently considered that the fellow HSG's 21 with a grain diameter of about 0.05 to 0.1 μm come into contact with each other if the method is a conventional method. However, according to the manufacturing method of this embodiment, it does not occur for the outer surfaces of the adjacent storage electrodes 7 to face to each other because of the existence of the above described protector film 16, and it does not occur for HSG's to grow in the mutually approaching direction, and accordingly, an occurrence of a failure of a short circuit can surely be prevented. As a result of that, the fining of a DRAM memory cell can be attained without lowering the yield.

Furthermore, in case of this embodiment, when forming the cylindrical portion of the storage electrode 7 by performing CMP of the amorphous silicon film 26, the resist is buried in the recess of the amorphous silicon film 26, and therefore, there is no probability that the amorphous silicon film 26 in the recess to be the storage electrode 7 is also attacked by the abrasive of CMP, and a storage electrode with a specific shape can be formed.

A second embodiment of the present invention will be described below by referring to FIG. 6 and FIG. 7.

Figure 6:
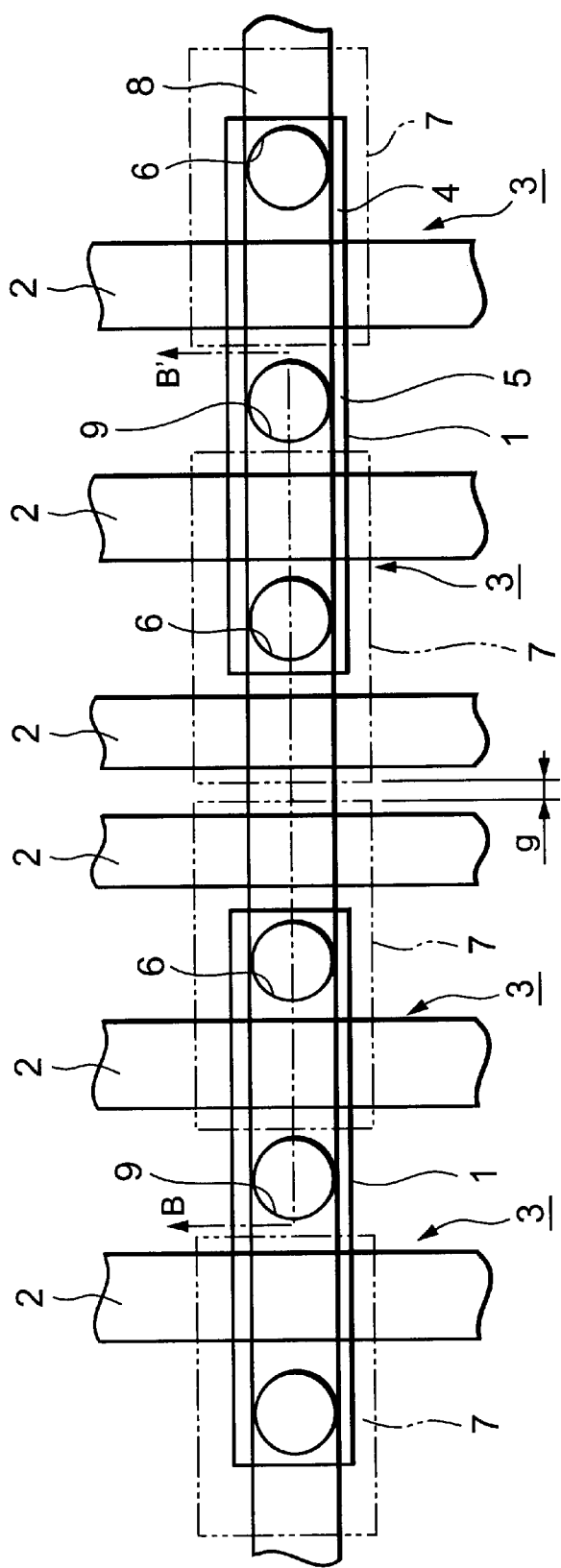
FIG. 6 is a plan view showing a memory cell of a DRAM which is a second embodiment of the present invention.
Figure 7:
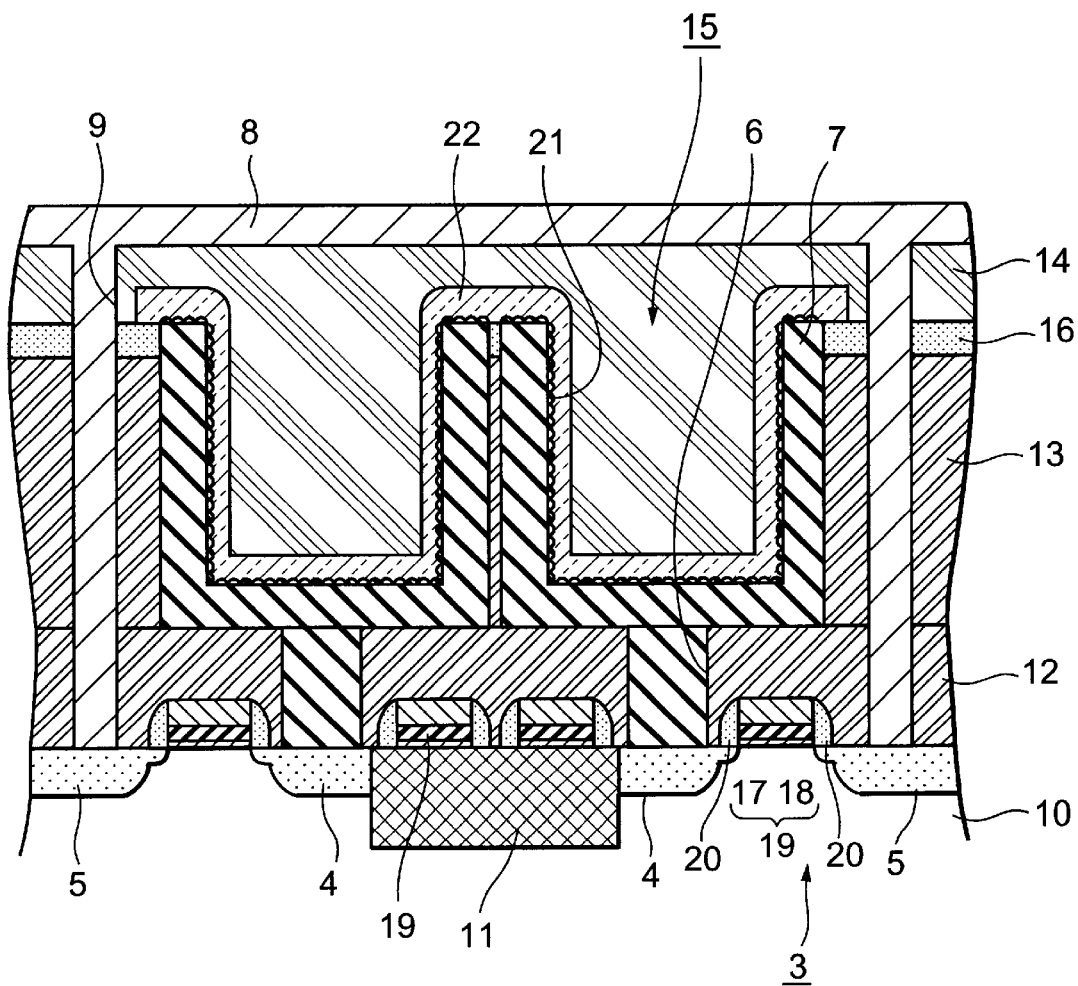
FIG. 7 is a cross sectional view along a line B–B' of FIG. 6.
Figure 8:
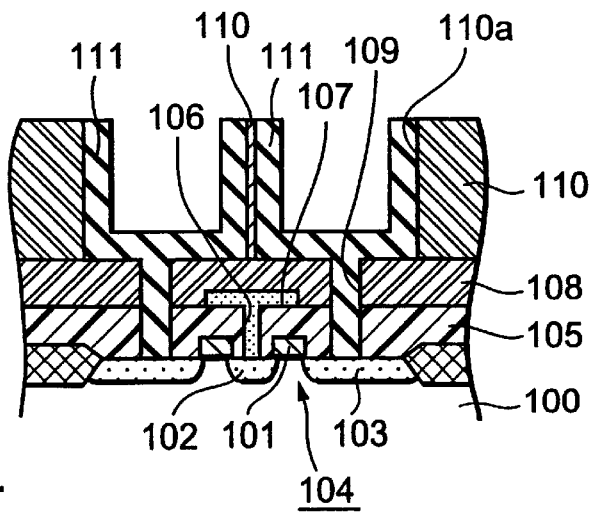
FIG. 8 is a process cross sectional view showing one example of the manufacturing process of a conventional DRAM memory cell.
Figure 8:
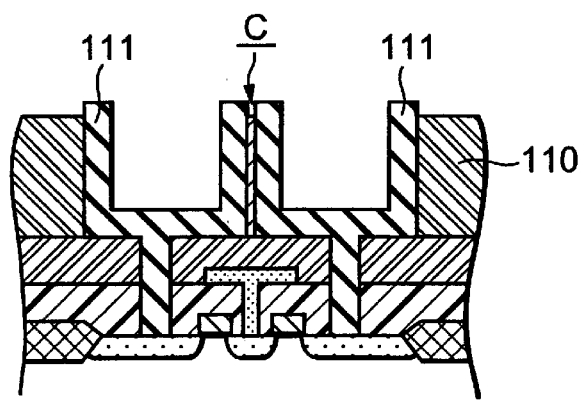
Figure 8:
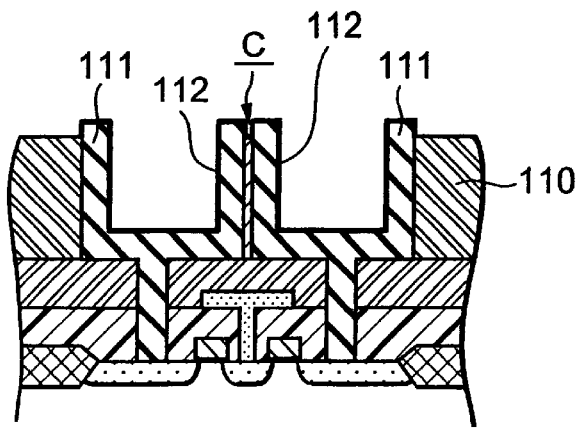

FIG. 6 is a plan view showing a memory cell of a DRAM (semiconductor device) of this embodiment, and FIG. 7 is a cross sectional view along the line B–B' of FIG. 6. The embodiment is an example where the present invention is applied to a DRAM memory cell with the CUB structure, and only the configuration will be described below, and the description of the manufacturing method will be omitted.

As shown in FIG. 6, two gate lines cross in one diffusion layer pattern 1, and two transistors 3 are formed. Supposing that this is 1 pair, 2 1 are shown in FIG. 6. On an n-type impurity diffusion layer 4 configuring a source area (or a drain area) of each transistor 3, a capacity contact hole 6 is formed, and a pattern of the storage electrode 7 is each formed to include the capacity contact hole 6 in the interior. In case of the CUB structure of this embodiment which is different from the case of the COB structure of the first embodiment, the bit line 8 can be arranged to pass on the capacity contact hole 6. Accordingly, the bit line 8 passes on the diffusion layer pattern 1, and the capacity contact hole 6 and the bit contact hole 9 are linearly arranged. In case of this embodiment, the positional relation of the bit contact hole 9 is different from that of the first embodiment, and therefore, a place between the storage electrodes 7 positioned on the different diffusion layer patterns 1 is the place with the narrowest space of the fellow storage electrodes 7 in the total of the memory cell, and the space g is, for example, about 0.15 μm.

By using FIG. 7, the cross sectional structure of the above described memory cell will be described. On the surface of the silicon substrate 10, a trench element separation oxide film 11 is formed, and in the active area except the element separation area, a transistor 3 is each formed. Over the transistor 3, a capacitor 15 shaped to be buried in the interior of the second interlayer insulator film 13 is formed through the first interlayer insulator film 12, and on the second interlayer insulator film 13, a protector film 16 is formed. Furthermore, on the capacitor 15, a third interlayer insulator film 14 is formed, and on the third interlayer insulator 14, a bit line 8 is formed. The material of each film in this embodiment is similar to that in the first embodiment. By the way, in FIG. 7, the gate electrode 19 arranged on the trench element separation oxide film 11 is the gate electrode of the transistor at the front stage or the rear stage of the memory cell shown in FIG. 6.

The gate electrode 19 of the transistor 3 is made of a tungsten polycide film of a DOPOS film 17 and a tungsten silicide film 18, and at the side wall of the gate electrode 19, a side wall 20 is formed, and the n-type impurity diffusion layers 4, 5 have the LDD structure. To one n-type impurity diffusion layer 4 of the transistor 3, the storage electrode 7 of the capacitor 15 is connected through the capacity contact hole 6, and on the surface of the silicon film of the storage electrode 7, a lot of HSG 21 is formed. Then, on the storage electrode 7, a capacity insulator film (omitted in the figure) and a counter electrode 22 are formed in turn, and a capacitor 15 is configured. Furthermore, to the other n-type impurity diffusion layer 5, the bit line 8 is connected through the bit contact hole 9.

In case of this embodiment, because of the existence of the protector film 16 on the second interlayer insulator film 13, it also does not occur for the second interlayer insulator film 13 to retreat in the hydrofluoric acid etching of the pretreatment of the HSG formation process, and therefore, an effect similar to that of the first embodiment can be achieved, by which a failure of a short circuit between the fellow storage electrodes 7 because of the HSG formation can be prevented. Furthermore, in the CUB structure of this embodiment, the bit line 8 is positioned on the capacitor 15, and therefore, the height of the capacitor 15 is limited, but according to the present method, a failure of a short circuit does not occur, and the surface area of the capacitor 15 can sufficiently be enlarged by the formation of the HSG 21, and a capacitor with a specific capacity value can be formed in a limited occupied area.

By the way, the technical range of the present invention is not limited to the above described embodiments, but various modifications can be added within the range of not deviating from the scope and spirit of the present invention. For example, in the above described embodiment, an example where a silicon nitride film is used as a protector film is shown, but not only a silicon nitride film but also an aluminum oxide film, a silicon carbide film or the like can also be used as long as it is a film having resistance to hydrofluoric acid etching. Furthermore, in the above described embodiment, a protector film is formed on the entire surface of the third interlayer insulator film and the second interlayer insulator film, and this protector film is left behind to the end. This method is simplest, but from the viewpoint of the object of the present invention of preventing a short circuit between the storage electrodes, it is also possible to remove the protector film after the HSG formation treatment. Or, it is sufficient that there is a protector film at least on the upper surface of the insulator film positioned between the adjacent storage electrodes, and for example, a configuration is also possible, where a protector film exists only at this place and the protector is not formed or is removed on the side of facing to no other storage electrode.

Furthermore, the concrete numerical values of the film thickness, size or the like of the various kinds of films shown in the above described embodiments are only one example, and of course, proper modifications can be made. Furthermore, in the above described embodiments, examples in which the present invention is applied to a DRAM are taken, but the present invention can also be applied to another semiconductor device having a similar cylinder-type capacitor.

As described above in detail, according to the present invention, a protector film having resistance to etching of a silicon oxide film is formed on the upper surface of an insulator film positioned between the adjacent lower electrodes, and therefore, even if an oxide film etching is performed as the pretreatment of the HSG formation process, this part does not retreat, and the upper end of the cylindrical lower electrode does not project to the above of the protector film. Accordingly, it does not occur for the HSG to grow in the mutually approaching direction in the fellow adjacent lower electrodes, and an occurrence of a failure of a short circuit between the fellow lower electrodes can surely be prevented. As a result of that, it is possible to contribute to the fining of a semiconductor device to which the present invention is applied, without causing the lowering of the yield.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device comprising:

a plurality of capacitors with a cylindrical lower electrode which is formed along a side and a bottom surface of a recess formed in an insulator film over a semiconductor substrate and which includes silicon having grained silicon on a surface; and a protector film which is formed at least on an upper surface of said insulator film positioned between said adjacent lower electrodes and for protecting said insulator film during an etching of a silicon oxide film.

2. The semiconductor device according to claim 1, wherein
  said protector film is any one of a silicon nitride film, an aluminum oxide film, or a silicon carbide film.

3. The semiconductor device according to claim 1, wherein
  said capacitor configures a DRAM memory cell together with a transistor formed on said semiconductor substrate.

4. The semiconductor device according to claim 3, wherein
  a bit line is provided under said capacitor.

5. The semiconductor device according to claim 3, wherein
  a bit line is provided over said capacitor.

6. The device of claim 1, wherein each capacitor in said plurality of capacitors is separated by about 0.15 $\mu$m.

7. The device of claim 1, wherein said protective film is resistant to hydrofluoric acid.

8. The device of claim 1, wherein said protective film prevents formation of grained silicon on an outer surface of said lower electrode.

9. The device of claim 1, wherein said protective film has a thickness of about 100 nm.

10. The device of claim 1, wherein said protective film comprises one of aluminum oxide and silicon carbide.

* * * * *